US009277329B2

(12) United States Patent
Schelling et al.

(10) Patent No.: US 9,277,329 B2
(45) Date of Patent: Mar. 1, 2016

(54) CAPACITIVE MEMS ELEMENT INCLUDING A PRESSURE-SENSITIVE DIAPHRAGM

(71) Applicants: Christoph Schelling, Stuttgart (DE); Rolf Scheben, Stuttgart (DE); Ricardo Ehrenpfordt, Korntal-Muenchingen (DE)

(72) Inventors: Christoph Schelling, Stuttgart (DE); Rolf Scheben, Stuttgart (DE); Ricardo Ehrenpfordt, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/470,619

(22) Filed: Aug. 27, 2014

(65) Prior Publication Data

US 2015/0063608 A1 Mar. 5, 2015

(30) Foreign Application Priority Data

Aug. 30, 2013 (DE) ........................ 10 2013 217 312

(51) Int. Cl.
*H04R 25/00* (2006.01)
*H04R 23/00* (2006.01)
*H04R 7/00* (2006.01)
(Continued)

(52) U.S. Cl.
CPC .................. *H04R 23/00* (2013.01); *H04R 7/00* (2013.01); *H04R 19/005* (2013.01); *H04R 19/016* (2013.01); *H04R 31/00* (2013.01); *H04R 19/01* (2013.01); *H04R 2201/003* (2013.01)

(58) Field of Classification Search
CPC ..... H04R 19/005; H04R 19/01; H04R 19/016
See application file for complete search history.

(56) References Cited

U.S. PATENT DOCUMENTS 3,786,495 A * 1/1974 Spence .................. H04R 19/01 257/417
6,806,593 B2 * 10/2004 Tai ....................... H04R 19/016 29/594

(Continued)

FOREIGN PATENT DOCUMENTS

| | | |
|---|---|---|
| DE | 2 153 784 | 5/1972 |
| JP | 2004/166262 | 6/2004 |

OTHER PUBLICATIONS

C. Thielemann et al., "A Micro-machined capacitive electret microphone", Design, Test, and Microfabrication of MEMS and MOEMS, International Society for Optics and Photonics, 1999, S. 748-756.

(Continued)

*Primary Examiner* — Curtis Kuntz
*Assistant Examiner* — Ryan Robinson
(74) *Attorney, Agent, or Firm* — Kenyon & Kenyon LLP

(57) ABSTRACT

An implementation for an electret in a capacitive MEMS element including a pressure-sensitive diaphragm, which is produce-able using standard methods of semiconductor technology for easy integration into the manufacturing process of MEMS semiconductor elements. Such MEMS elements include at least one pressure-sensitive diaphragm including at least one deflectable diaphragm electrode of a capacitor system for signal detection and one fixed non-pressure-sensitive counter-element including at least one counter-electrode of this capacitor system, at least one electrode of the capacitor system being provided with an electrically charged electret, so that there is a potential difference between the two electrodes of the capacitor system. The electret includes at least two adjacent layers made from different dielectric materials, electrical charges being stored on their boundary surface.

5 Claims, 1 Drawing Sheet

(51) Int. Cl.
*H04R 19/00* (2006.01)
*H04R 31/00* (2006.01)
*H04R 19/01* (2006.01)

(56) References Cited

U.S. PATENT DOCUMENTS 7,706,554 B2 * 4/2010 Ogura .................. H04R 19/016 257/416
8,073,166 B2 12/2011 Takeuchi et al.
8,975,791 B2 * 3/2015 Leonov .................... H01G 7/02 307/400
2007/0217635 A1 9/2007 Ogura et al.
2007/0230722 A1 * 10/2007 Mori .................... H04R 19/016 381/174
2009/0034760 A1 * 2/2009 Minamio ............. H04R 19/005 381/175
2010/0002895 A1 * 1/2010 Notake ................. B81B 3/0051 381/174
2011/0044480 A1 2/2011 Yamaoka et al.

OTHER PUBLICATIONS

J.Lin et al., "Two-cavity MEMS variable capacitor for power harvesting". J. Micromech. Microeng. 22, 2012, S. 1-9. (http://iopscience.iop.org/0960-1317/22/6/065003), (Downloaded on Nov. 18, 2013 at 20:35.).

* cited by examiner

CAPACITIVE MEMS ELEMENT INCLUDING A PRESSURE-SENSITIVE DIAPHRAGM

RELATED APPLICATION INFORMATION

The present application claims priority to and the benefit of German patent application no. 10 2013 217 312.1, which was filed in Germany on Aug. 30, 2013, the disclosure of which is incorporated herein by reference.

FIELD OF THE INVENTION

The present invention relates to a MEMS element, including at least one pressure-sensitive diaphragm including at least one deflectable diaphragm electrode of a capacitor system for signal detection and one fixed non-pressure-sensitive counter-element including at least one counter-electrode of this capacitor system, at least one electrode of the capacitor system being provided with an electrically charged electret, so that a potential difference exists between the two electrodes of the capacitor system.

Capacitive MEMS elements of the type discussed here are used in practice, for example, for pressure detection. Microphone applications represent another important area of use. In this case, the sound pressure deflects the diaphragm of the component structure, which results in a change of capacitance between the diaphragm electrode and the counter-electrode on the fixed counter-element of the component structure. The change in capacitance caused by the sound effect may be detected as a change in voltage, if a bias voltage is applied to the capacitor system. This type of signal detection is extremely sensitive, has low noise and is temperature-stable.

In U.S. Pat. No. 8,073,166 B2, an MEMS microphone element is described, in which the potential difference between the electrodes of the microphone capacitor required for the signal detection is not generated by application of a voltage, i.e., with the aid of a charge pump, but instead with the aid of an electret layer on the diaphragm electrode. The potential difference between the capacitor electrodes is maintained in this case by electrical charge carriers, which are permanently stored or embedded in the electret layer. This makes it possible to omit a charge pump and thus significantly reduce the power consumption of the microphone element. Moreover, the chip surface required for a charge pump is saved.

In U.S. Pat. No. 8,073,166 B2, it is provided to implement the electret layer in the form of a dielectric layer, for example, one made from organic fluorinated ethylene propylene (FEP), into which ions are injected. For this purpose, a wire or needle electrode is positioned above the dielectric layer as an ion source. Applying a voltage between this wire or needle electrode and an electrode beneath the dielectric layer causes a corona discharge to occur at the electrode tip. In this process, ions emerge from the electrode tip, which are accelerated due to the applied electrical field in the direction of the dielectric layer in such a way that they penetrate into the dielectric layer and are embedded there.

This form of implementation of an electret layer proves to be problematic in several respects. On the one hand, the known manufacturing method, in particular the generation and introduction of the ions into the dielectric layer, is relatively complex and is not easily integratable into the manufacturing process of MEMS semiconductor elements. On the other hand, this manufacturing method in practice frequently results in a non-uniform charge distribution in the electret layer, since the charge carriers are unable to move freely in the dielectric layer. This is detrimental to the performance of the element.

SUMMARY OF THE INVENTION

The present invention provides a form of implementation for an electret in a capacitive MEMS element including a pressure-sensitive diaphragm, which may be produced using standard methods of semiconductor technology and thus may be integrated easily into the manufacturing process of MEMS semiconductor elements.

According to the present invention, the electret of an MEMS element of the above-named type includes at least two adjacent layers made from different dielectric materials, electrical charges being stored on their boundary surface.

According to the present invention, it has namely been found that the boundary surface between two non-conductive layers is in particular very suitable for charge storage, since boundary surface defects generally occur in great density there. These represent localized states in which charges may be stored in a stable condition on a long-term basis, if sufficiently large energy barriers with respect to the conductive layer of an adjacent electrode exist in the dielectric layers for the charge carriers. According to the present invention, it has been further found that the electrical charges may be very easily injected at the boundary surface of the two dielectrics, namely by a one-time application of a high electrical field across the two dielectric layers. It is a particular advantage that a uniform charge distribution occurs at the boundary surface in this way. Even if the electrical voltage is removed again after the injection, the electrical charges remain at the boundary surface between the two dielectric layers and generate influence charges at least in the adjacent electrode of the capacitor system, the influence charges providing for a uniform electrical field in the capacitive gap.

Basically, entirely different materials may be used for the dielectric layers of the electret according to the present invention. As already mentioned, these dielectric materials must include sufficient band offsets, both in the valence band and in the conduction band, in relation to the conductive material of an adjacent electrode. Dielectric materials composed of the elements Si, N, C, B, P, O and/or Al, such as SiO2, Si3N4, $Si_{1-x}N_x$ ($0 \le x \le 0.5$), $Si_{1-x-y}C_xN_y$ ($0 \le x \le 0.5$; $0 \le y \le 0.5$) and Al2O3 are therefore particularly well suited. If the structure of the MEMS element according to the present invention is produced using sacrificial layer technology, the combination of materials $Si_{1-x-y}C_xN_y$ with Al2O3 is particularly advantageous, since these materials are generally not used as sacrificial layer materials and are also not attacked by the sacrificial layer-etching media which are normally used.

The two dielectric layers of the MEMS element according to the present invention forming the electret may be formed either on the diaphragm electrode or on the counter-electrode. Basically variants are also conceivable in which the two electrodes of the capacitor system are provided with an electret layer structure according to the present invention. In this case, the electret layer structures must, however, be inversely charged, so that due to the particular influence charge in the adjacent electrodes of the capacitor system a potential difference exists between the electrodes, which makes capacitive signal detection possible.

In one specific embodiment of the present invention, the layer structure of the electrode of the capacitor system provided with the electret includes a first electrode layer, at least two dielectric layers and a second electrode layer, so that the application of a high voltage between the two electrode layers makes it possible to inject electrical charges at the boundary surface of the dielectric layers. In this case, the electret does not have to be charged during the manufacturing process of the MEMS element, but instead it may also be carried out after completion in the already packaged condition of the MEMS element, advantageously during the electrical balancing of the MEMS element.

BRIEF DESCRIPTION OF THE DRAWINGS

As has already been discussed above, there are various options for developing and refining the teaching of the present invention in an advantageous manner. For this purpose, reference is made, on the one hand, to the patent claims subordinated to independent Patent claim 1 and, on the other hand, to the following description of two exemplary embodiments of the present invention based on the drawings.

DETAILED DESCRIPTION OF THE INVENTION

Figure 1:
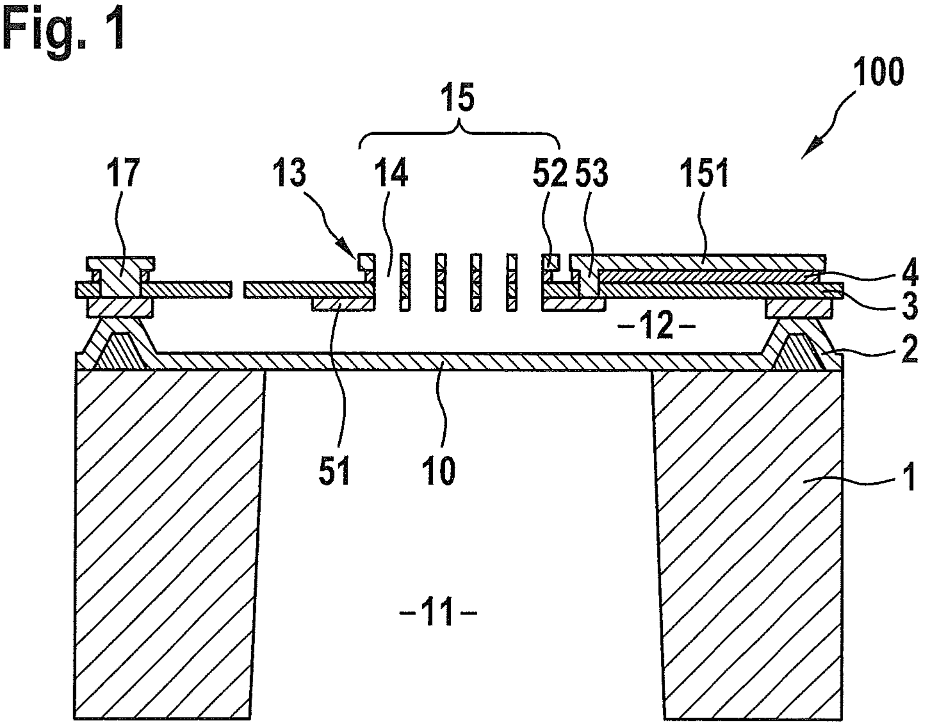
FIG. 1 shows a schematic sectional representation of a first MEMS microphone element 100 according to the present invention and FIG. 2 shows a schematic sectional representation of a second MEMS microphone element 200 according to the present invention.

The two MEMS elements 100 and 200 shown in the drawings are capacitive microphone elements, the microphone structure of which is implemented in a layer structure on a substrate 1. The microphone structure in each case includes one microphone diaphragm 10, which is deflectable by the sound pressure, the microphone diaphragm spanning an opening 11 in the rear side of the substrate. Microphone diaphragm 10 is in this case formed in a thin conductive layer 2, for example, in a thin polysilicon layer which is doped at least in areas, so that microphone diaphragm 10 functions as a diaphragm electrode of a capacitor system for signal detection. A fixed acoustically permeable counter-element 13 having passage openings 14 and including a fixed counter-electrode 15 of the capacitor system is located in the layer structure above microphone diaphragm 10 at a distance from it. The electrical terminal of counter-electrode 15 is implemented in the form of a conducting track 151 and a terminal pad, which are formed in the same electrode layer 52 as counter-electrode 15. Diaphragm electrode 10 is electrically contacted by a via 17 in the layer structure of counter-element 13.

The sound pressure may be applied to microphone membrane 10 either via opening 11 in the substrate rear side or on the front side via passage openings 14 in counter-element 13. In the process, microphone diaphragm 10 is deflected, causing a change in the distance between electrodes 10 and 15 of the capacitor system. This distance change may be detected as a voltage change, if a sufficiently high potential difference exists between electrodes 10 and 15 of the capacitor system. In the case of the exemplary embodiments described here, counter-electrode 15 was provided for that purpose with an electret in which electrical charges are stored permanently.

This causes influence charges to be generated in the two electrodes 10 and 15 of the capacitor system, the influence charges ensuring the presence of an electrical field in capacitive gap 12 between the two electrodes 10 and 15.

According to the present invention, the electret is composed of two adjacent layers 3 and 4 made from different dielectric materials, electrical charges being stored on their boundary surface.

Advantageously, the dielectric materials of these two layers 3, 4 are composed of the elements Si, N, C, B, P, O and/or Al. Here, they may be, for example, SiO2, Si3N4, $Si_{1-x}N_x$ (silicon-enriched nitride), $Si_{1-x-y}C_xN_y$ (silicon carbonitride) or Al2O3. The material combinations of SiO2 with Si3N4 and $Si_{1-x-y}C_xN_y$ have particularly good electret properties.

In the case of microphone element 100 shown in FIG. 1, the layer structure of counter-element 13 includes two electrode layers 51 and 52, which surround the two dielectric layers 3 and 4 in the manner of a sandwich and may be electrically contacted independently of one another. In the exemplary embodiment shown here, first electrode layer 51 is contacted using a via 53 through the two dielectric layers 3 and 4, which contributes to the avoidance of parasitic capacitances. At this point, it should be noted that the two electrode layers 51 and 52 may each be additionally embedded in a passivation layer, for example, in an SiO2 layer for protection against corrosion and other environmental influences.

The application of high voltage between the two electrode layers 51 and 52 caused electrical charges to be injected at the boundary surface between the two dielectric layers 3 and 4, which remain there after this voltage is switched off and are stored permanently. In this way, the two dielectric layers 3 and 4 form an electret, with the aid of which a potential difference is maintained permanently between the two electrodes 10 and 15 of the capacitor system.

Figure 2:
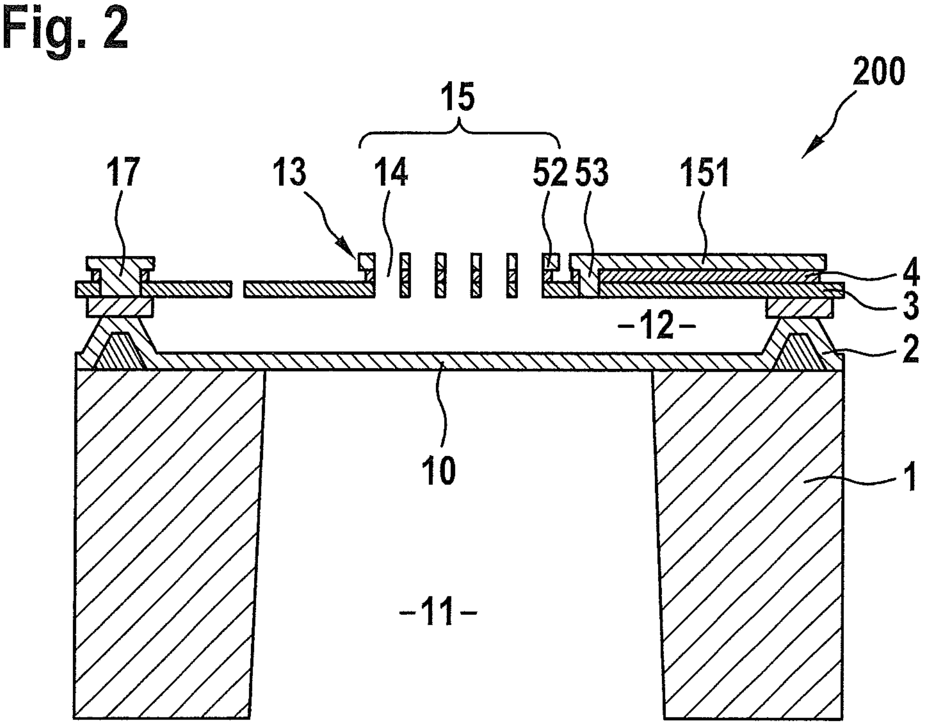

After the charge process of the boundary layer between dielectric layers 3 and 4, one electrode layer 51 or 52 may be removed using a suitable etching method. In the case of microphone element 200 shown in FIG. 2, electrode layer 51 on the underside of counter-element 13 was removed from capacitive gap 12.

The above-described measures according to the present invention make possible a cost-effective implementation of electret-based MEMS pressure sensor elements and MEMS microphone elements having a very small chip surface and low power consumption. Since the potential difference between the electrodes of the capacitor system for signal detection is maintained in this case due to the electrical charges permanently stored in the electret, the application of a bias voltage may be omitted. Also, a "wake-up" function, which allows the power consumption of the element to be significantly reduced in the resting state, may be implemented with the aid of the electret. Due to the distance change between the electrical charge stored in the electret and the diaphragm electrode caused by an external pressure pulse or a sound event, a current is induced, which is sufficient for activating the signal processing of an ASIC.

What is claimed is:

1. A MEMS element, comprising:
one pressure-sensitive diaphragm including at least one deflectable diaphragm electrode of a capacitor system for signal detection; and
one fixed non-pressure-sensitive counter-element including at least one counter-electrode of this capacitor system;
wherein at least one electrode of the capacitor system is provided with an electrically charged electret, so that a potential difference exists between the two electrodes of the capacitor system, and
wherein the electret includes at least two adjacent layers made from different dielectric materials, electrical charges being stored on their boundary surface;
wherein the layer structure of the electrode including the electret includes at least one first electrode layer, at least two dielectric layers and one second electrode layer, wherein the second electrode layer contacts the first electrode layer using a via through the at least two dielectric layers, so that the application of a high voltage between the two electrode layers allows for injecting electrical charges at the boundary surface of the dielectric layers.

2. The MEMS element of claim 1, wherein the dielectric materials of the adjacent layers are composed of the elements Si, N, C, B, P, O and/or Al.

3. The MEMS element of claim 1, wherein the adjacent layers are formed from $SiO_2$, $Si_3N_4$, $Si_{1-x-y}C_xN_y$ or $Al_2O_3$.

4. The MEMS element of claim 1, wherein the adjacent layers are formed from $SiO_2$ and $Si_3N_4$ or from $Si_{1-x-y}C_xN_y$ and $Al_2O_3$ or from $Si_{1-x}N_x$ and $Al_2O_3$.

5. A MEMS microphone element, comprising:

one microphone diaphragm which is deflectable by the sound pressure, including at least one diaphragm electrode of a capacitor system for signal detection and one fixed acoustically permeable counter-element having passage openings and including at least one counter-electrode of this capacitor system, wherein at least one electrode of the capacitor system is provided with an electret, which includes at least two adjacent layers made from different dielectric materials, electrical charges being stored on their boundary surface, so that a potential difference exists between the two electrodes of the capacitor system, wherein a layer structure of the electrode including the electret includes at least one first electrode layer, at least two dielectric layers and one second electrode layer, wherein the second electrode layer contacts the first electrode layer using a via through the at least two dielectric layers, so that an application of a high voltage between the two electrode layers allows for injecting electrical charges at the boundary surface of the dielectric layers.

* * * * *